(12) United States Patent
Lopez-Julia et al.

(10) Patent No.: US 11,641,007 B2
(45) Date of Patent: May 2, 2023

(54) LIGHT-EMITTING DEVICE WITH INTERNAL NON-SPECULAR LIGHT REDIRECTION AND ANTI-REFLECTIVE EXIT SURFACE

(71) Applicant: LUMILEDS LLC, San Jose, CA (US)

(72) Inventors: Antonio Lopez-Julia, Aachen (DE); Venkata Ananth Tamma, San Jose, CA (US); Aimi Abass, Aachen (DE); Philipp-Immanuel Schneider, Berlin (DE)

(73) Assignee: Lumileds LLC, San Jose, CA (US)

( * ) Notice: Subject to any disclaimer, the term of this patent is extended or adjusted under 35 U.S.C. 154(b) by 115 days.

(21) Appl. No.: 17/121,014

(22) Filed: Dec. 14, 2020

(65) Prior Publication Data

US 2021/0184081 A1   Jun. 17, 2021

Related U.S. Application Data

(60) Provisional application No. 62/948,704, filed on Dec. 16, 2019.

(30) Foreign Application Priority Data

Mar. 3, 2020 (EP) ..................................... 20160667

(51) Int. Cl.
*H01L 33/44* (2010.01)
*H01L 33/58* (2010.01)
*H01L 33/00* (2010.01)

(52) U.S. Cl.
CPC ............ *H01L 33/44* (2013.01); *H01L 33/005* (2013.01); *H01L 33/58* (2013.01); *H01L 2933/0025* (2013.01)

(58) Field of Classification Search
CPC ........ H01L 33/44; H01L 33/005; H01L 33/58; H01L 2933/0025
See application file for complete search history.

(56) References Cited

U.S. PATENT DOCUMENTS

| 6,057,587 A | * | 5/2000 | Ghandehari | ........ H01L 21/0332 257/749 |
| 2008/0303047 A1 | * | 12/2008 | Shen | ....................... H01L 33/22 257/E33.073 |

(Continued)

OTHER PUBLICATIONS

The extended European Search Report corresponding to EP application No. 20160667.0, dated Aug. 28, 2020, 13 pages.

(Continued)

*Primary Examiner* — Jay C Chang
*Assistant Examiner* — Mikka Liu

(57) ABSTRACT

A light-emitting device includes a semiconductor diode structure with one or more light-emitting active layers, an anti-reflection coating on its front surface, and a redirection layer on its back surface. Active-layer output light propagates within the diode structure. The anti-reflection coating on the front surface increases transmission of active-layer output light incident below the critical angle $\Theta_C$. Active-layer output light incident on the redirection layer at an incidence angle greater than $\Theta_C$ is redirected to propagate toward the front surface at an incidence angle that is less than $\Theta_C$. Device output light is transmitted by the front surface to propagate in an ambient medium, and includes first and second portions of the active-layer output light incident on the front surface at an incidence angle less than $\Theta_C$, the first portion without redirection by the redirection layer and the second portion with redirection by the redirection layer.

20 Claims, 2 Drawing Sheets

(56) References Cited

U.S. PATENT DOCUMENTS

2018/0278024 A1   9/2018   Gronenbom et al.
2019/0115492 A1   4/2019   Tamma et al.
2020/0200955 A1   6/2020   Lopez-Julia et al.

OTHER PUBLICATIONS

Hsin-Ying Lee, et al., "Performance Improvement of GaN-Based Flip-Chip White Light-Emitting Diodes with Diffused Nanorod Reflector and with ZnO Nanorod Anti reflection Layer", Journal of Nanomaterials, vol. 2014, Jan. 1, 2014, pp. 1-6.
Yu-Chig Chang, et al., "Improved Extraction Efficiency of a High-Power GaN-Based Light -Emitting Diode with a Three-Dimensional-Photonic Crystal (3-D-PhC) Backside Reflector", IEEE Electron Device Letters, IEEE, vol. 34, No. 6, Jun. 1, 2013, pp. 777-779.
Li et al., "All-Dielectric Antenna Wavelength Router with Bidirectional Scattering of Visible Light," Nano Letters, 16 4396 (2016).
Shibanuma et al., "Experimental Demonstration of Tunable Directional Scattering of Visible Light from All-Dielectric Asymmetric Dimers," ACS Photonics, 4 489 (2017).

\* cited by examiner

LIGHT-EMITTING DEVICE WITH INTERNAL NON-SPECULAR LIGHT REDIRECTION AND ANTI-REFLECTIVE EXIT SURFACE

BENEFIT CLAIMS TO RELATED APPLICATIONS

This application claims benefit of U.S. provisional App. No. 62/948,704 entitled "Light-emitting device with internal non-specular light redirection and anti-reflective exit surface" filed Dec. 16, 2019 in the names of Antonio Lopez-Julia, Venkata Ananth Tamma, Aimi Abass, and Philipp Schneider. This application claims priority of EP App. No. 20160667.0 entitled "Light-emitting device with internal non-specular light redirection and anti-reflective exit surface" filed Mar. 3, 2020 in the names of Antonio Lopez-Julia, Venkata Ananth Tamma, Aimi Abass, and Philipp Schneider. Both of said applications are incorporated by reference as if set forth herein in their entireties.

FIELD OF THE INVENTION

The field of the present invention relates to light-emitting devices. Devices are disclosed herein that include internal, non-specular light redirection and an anti-reflective exit surface, resulting in enhanced light extraction efficiency.

BACKGROUND

Typical light-emitting diodes (LEDs) include an internal active layer within a semiconductor diode structure that emits light when driven by an electric current. The back surface of the semiconductor diode structure (and in some instances one or more or all side surfaces) typically includes a reflector that reflects light incident within the semiconductor diode structure to propagate toward the front surface of the diode structure (the front surface can also be referred to herein as the exit surface). Many semiconductor materials have relatively large refractive indices (often around 3 or more) which would result in a large fraction of the emitted light being trapped within the semiconductor diode structure by total internal reflection. In some conventional light-emitting diodes texturing (e.g., corrugations, bumps or dimples, or other surface features or roughness) is formed on or attached to the front surface of the semiconductor diode structure (also referred to as the exit surface). The back-surface reflector in such so-called cavity emitters ensures that nearly all light propagating within the semiconductor diode structure eventually is incident on the front surface. The front-surface texturing serves to spoil total internal reflection at least partly, allowing a portion of the emitted light to escape the semiconductor diode structure through the front surface as device output light, while redirecting other portions propagate to within the semiconductor diode structure in directions that differ from that of a specular reflection from a flat exit surface. Those redirected portions eventually reach the front surface again and have another opportunity to escape by transmission through the front surface. This light recirculation process continues, and each so-called "photon bounce" (i.e., each round trip back and forth between the front and back surfaces through the semiconductor diode structure) within the effective "LED cavity" formed by the back-surface reflector and the front-surface texturing increases the overall probability of that photon escaping through the front surface as device output light.

One example of a conventional LED cavity emitter 10 is illustrated schematically in FIG. 6 and includes a semiconductor diode structure 12, a light-emitting active layer 14 within the semiconductor diode structure 12, texturing 16 on the front surface of the semiconductor diode structure 12, and a reflector 18 on the back surface of the semiconductor diode structure 12. Another example of a conventional LED cavity emitter 20 is illustrated schematically in FIG. 7 and includes a semiconductor diode structure 12, a light-emitting active layer 14 within the semiconductor diode structure 12, texturing 16 on the front surface of the diode structure 12, a dielectric layer 19 on the back surface of the diode structure 12, and a reflector 18 on the back surface of the dielectric layer 19.

The practical reality, however, is that the probability per bounce of a photon being transmitted through the front surface is relatively low, which in turn requires a relatively large number of round trips to achieve a sufficiently high probability of photon extraction (e.g., 10 to 50 bounces to achieve extraction efficiency approaching 90%, depending on the particular materials employed). That relatively high number of round trips or photon bounces in turn requires sufficiently low optical loss per round trip through the semiconductor diode structure (e.g., loss due to absorption by diode structure, active layer, or reflector materials, or insufficient reflectivity of the reflector). That low-loss requirement in some cases can drive up the cost or complexity of the light-emitting device (e.g.: use of a silver reflector instead of aluminum; use of a multi-layer thin film reflector instead of a metal reflector; or use of higher-purity materials for diode structure, active layer, or reflector), or result in devices with low extraction efficiency (e.g., if low-loss alternatives are unavailable or cost-prohibitive).

SUMMARY

An inventive light-emitting device comprises a semiconductor diode structure having front and back surfaces, one or more light-emitting active layers within the semiconductor diode structure, an anti-reflection coating on the front surface, and a redirection layer on the back surface. The front surface is positioned against an ambient medium, and that interface is characterized by a critical angle $\Theta_C$ at a nominal vacuum wavelength $\lambda_0$. The one or more active layers emit active-layer output light characterized by the nominal vacuum wavelength $\lambda_0$ to propagate within the semiconductor diode structure. The anti-reflection coating on the front surface of the semiconductor diode structure exhibits reflectivity, for light incident on the front surface within the semiconductor diode structure at an incidence angle less than $\Theta_C$ and at the nominal vacuum wavelength $\lambda_0$, that is less than corresponding Fresnel reflectivity between semiconductor diode structure material and the ambient medium without the anti-reflection coating. The redirection layer includes one or more of (i) an array of nano-antennae, (ii) a partial photonic bandgap structure, (iii) a photonic crystal, (iv) an array of meta-atoms or meta-molecules, or (v) a diffuse backscatterer. Some active-layer output light, incident within the semiconductor diode structure on the redirection layer at an incidence angle greater than $\Theta_C$, is redirected by the redirection layer to propagate toward the front surface of the semiconductor diode structure at an incidence angle with respect to the front surface that is less than $\Theta_C$. Device output light is transmitted by the front surface to propagate in the ambient medium. The device output light includes first and second portions of the active-layer output light propagating within the semiconductor diode structure and incident on the front surface within the diode structure at an incidence angle less than $\Theta_C$, the first portion without redirection by the redirection layer and the second portion with redirection by the redirection layer.

In some examples the inventive light-emitting device can exhibit a photon extraction efficiency that is greater than about 80.%, greater than about 90.%, or greater than about 95.%. In some examples the inventive light-emitting device can exhibit a mean number of redirections per photon emitted by the active layer, by the redirection surface before transmission by the front surface, that is less than 30, less than 20, less than 10, or less than 5.

In some examples the redirection layer can exhibit an efficiency of redirection, of the light incident within the semiconductor diode structure on the redirection layer at an incidence angle greater than $\Theta_C$ to propagate toward the front surface of the diode structure at an incidence angle with respect to the front surface that is less than $\Theta_C$, that is greater than about 80.%, greater than about 85.%, greater than about 90.%, or greater than about 95.%, so that all light recirculation takes place between the front and back surfaces of the semiconductor diode structure. In some other examples, the light-emitting device can further include a lower-index dielectric layer on the back surface of the redirection layer, and a reflective layer on the back surface of the dielectric layer; in such examples at least some light recirculation occurs between the front surface and the reflective layer and at least partly within the dielectric layer.

Objects and advantages pertaining to light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. In particular, the height, depth, or width of various elements often can be exaggerated relative to other elements or, e.g., the thickness of an underlying substrate or diode structure. The embodiments shown are only examples and should not be construed as limiting the scope of the present disclosure or appended claims.

DETAILED DESCRIPTION OF EMBODIMENTS

It would be desirable to provide an inventive light-emitting device that exhibits a relatively high photon extraction efficiency (e.g., 80% or more) and a relatively reduced number of photon bounces (e.g., 30 or fewer).

For purposes of the present disclosure and appended claims, "incidence angle" and "angle of incidence" of light incident on a surface or interface refers to the angle between the propagation direction of the incident light and a vector normal to the surface or interface. Accordingly, light propagating at normal incidence with respect to a surface would have an incidence angle of 0°, while light propagating near grazing incidence with respect to that surface would have an incidence angle approaching 90°. For purposes of the present disclosure and appended claims, the "critical angle" for light incident on a surface or interface between media of differing refractive indices refers to the incidence angle, for light propagating within the higher index medium, above which the light undergoes total internal reflection within the higher-index medium. For purposes of the present disclosure and appended claims, "oblique light" or "oblique radiation" shall refer to light propagating within a substrate or diode structure at incidence angles greater than $\Theta_C$ with respect to the front and back surfaces thereof, while "perpendicular light" or "perpendicular radiation" shall refer to light propagating within a substrate or diode structure at incidence angles less than $\Theta_C$ with respect to those surfaces, even if not literally perpendicular; "normal" shall be reserved for light incident at an incidence angle of 90°. For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures.

Figure 1:
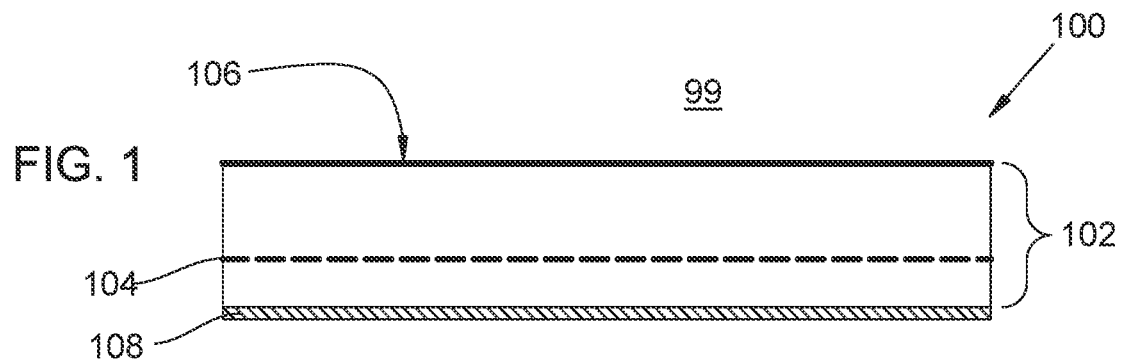
FIG. 1 is a schematic cross-sectional view of an example of an inventive light-emitting device.

A first example of an inventive light-emitting device 100 is illustrated schematically in FIG. 1 and includes a semiconductor diode structure 102, one or more light-emitting active layers 104, an anti-reflection coating 106 on the front surface (i.e., the exit surface) of the semiconductor diode structure 102, and a redirection layer 108 on the back surface of the semiconductor diode structure 102. The front surface of the semiconductor diode structure 102 is positioned against an ambient medium 99 and characterized by a critical angle $\Theta_C$ at a nominal vacuum wavelength $\lambda_0$. In many typical examples the semiconductor diode structure includes reflective coatings on one or more or all lateral surfaces thereof; those lateral reflective coatings can be of any suitable type or arrangement, and act to reflect any light incident thereon within the semiconductor diode structure 102. One or more light-emitting active layers 104 within the semiconductor diode structure 102 are arranged so as to emit active-layer output light (at the nominal vacuum wavelength $\lambda_0$) to propagate within the semiconductor diode structure 102. "At a nominal vacuum wavelength $\lambda_0$" means that the wavelength spectrum of the device output light includes a range of wavelengths that includes $\lambda_0$. In many examples the device output light is within about ±5 nm or about ±10 nm of $\lambda_0$; in other examples the spectral width of the device output light can be greater than that.

In some examples the front surface of the semiconductor diode structure 102 is positioned against an ambient medium 99 that is vacuum, air, a gaseous medium, or a liquid medium. In some examples the ambient medium 99 includes one or more substantially solid materials among: doped or undoped silicone, or one or more doped or undoped polymers. In some examples the nominal output vacuum wavelength $\lambda_0$ is larger than about 0.20 µm, larger than about 0.4 µm, larger than about 0.8 µm, smaller than about 10. µm, smaller than about 2.5 µm, or smaller than about 1.0 µm. In some examples the light-emitting device 100 comprises a light-emitting diode. In some examples the semiconductor diode structure 102 or active layer 104 includes one or more doped or undoped III-V, II-VI, or Group IV semiconductor materials or alloys or mixtures thereof. Note that the semiconductor diode structure 102 and active layer(s) 104 typically are formed together by a process sequence, often with the active layer(s) 104 formed on a surface of an initial semiconductor layer or substrate and then additional semiconductor material deposited over the active layers; other suitable fabrication sequences can be employed. In some examples the light-emitting layer 104 includes one or more doped or undoped III-V, II-VI, or Group IV semiconductor materials or alloys or mixtures thereof. In some examples the light-emitting layer 104 includes one or more p-n junctions, one or more quantum wells, one or more multi-quantum wells, or one or more quantum dots. The light emitting device 100 typically includes one or more electrodes (not shown) for delivering electric current to the active layer 104 to produce the active-layer output light.

For light at the nominal vacuum wavelength $\lambda_0$ that is incident on the front surface within the semiconductor diode structure 102 at an incidence angle less than $\Theta_C$ (i.e., for perpendicular light), the anti-reflection coating 106 on the front surface of the semiconductor diode structure 102 exhibits reflectivity that is less than corresponding Fresnel reflectivity between semiconductor material and the ambient medium 99 without the anti-reflection coating 106. The anti-reflection coating 106 can be of any suitable type or arrangement. In some examples the anti-reflection coating 106 includes a single-layer quarter-wave dielectric thin film. In some examples the anti-reflection coating 106 includes a multi-layer dielectric thin film. In some examples the anti-reflection coating 106 includes a moth-eye structure or other similar nanostructured film, or a gradient-index film. In principle the reflectivity of the front surface of the semiconductor diode structure 102 is most desirably reduced to zero. In practice, in some examples the anti-reflection coating 106 can reduce the reflectivity of the front surface of the semiconductor diode structure 102 to less than about 10.%, less than about 5.%, less than about 2.0%. less than about 1.0%, or less than about 0.5%. Contrast that with Fresnel reflectivity (at normal incidence) of an interface between a semiconductor and air (about 25%) or between a semiconductor and silicone (about 11%).

The redirection layer 108 on the back surface of the semiconductor diode structure 102 includes one or more of (i) an array of nano-antennae, (ii) a partial photonic bandgap structure, (iii) a photonic crystal, (iv) an array of meta-atoms or meta-molecules (described further below), or (v) a diffuse backscatterer. The redirection layer 108 is arranged so that at least a portion of light incident within the semiconductor diode structure 102 at an incidence angle greater than $\Theta_C$ (i.e., oblique light) is redirected to propagate within the semiconductor diode structure 102 at an angle less than $\Theta_C$ (i.e., as perpendicular light). By the reciprocity of Maxwell's equations, such a redirection layer 108 will also redirect perpendicular light to propagate as oblique light. An effect of the anti-reflection coating 106 on the front surface of the semiconductor diode structure 102 is to enable perpendicular light propagating within the semiconductor diode structure 102 to escape by transmission through the front surface as device output light instead of being reflected by the front surface and redirected as oblique light by the redirection layer 108. In principle that redirected oblique light can be redirected again to propagate as perpendicular light and escape through the front surface, but at the expense of another round trip through the semiconductor diode structure 102.

Figure 2:
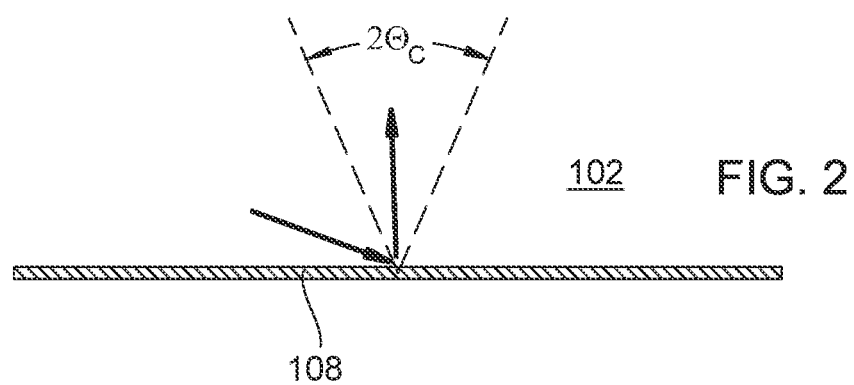
FIG. 2 illustrates schematically an example of redirection of active-layer output light.

In the example of FIG. 1, a first fraction of the active-layer output light propagates as perpendicular light directly from the active layer 104 to the front surface and is mostly transmitted (depending on the effectiveness of the anti-reflection coating 106) as a first portion of the device output light. A second fraction of the active-layer output light propagates as oblique light within the semiconductor diode structure 102 from the active layer 104 and is incident on the redirection layer 108, with or without one or more total internal reflections from front or lateral surfaces of the semiconductor diode structure 102. As depicted schematically in FIG. 2, the redirection layer 108 redirects at least a portion of incident oblique light to propagate toward the front surface of the semiconductor diode structure 102 as perpendicular light, which is mostly transmitted (depending on the effectiveness of the anti-reflection coating 106) as a second portion of the device output light. A third fraction of the active-layer output light propagates as perpendicular light within the semiconductor diode structure 102 directly from the active layer 104 to the redirection layer 108. Due to the reciprocity of Maxwell's equations, the redirection layer 108 redirects at least a portion of the perpendicular light to propagate toward the front surface of the semiconductor diode structure 102 as oblique light. After a round trip through the semiconductor diode structure 102 and back, including total internal reflection at the front surface of the semiconductor diode structure 102, the third fraction is incident again on the redirection surface 108 as oblique light, redirected to propagate toward the front surface as perpendicular light, and mostly escapes by transmission through the front surface of the semiconductor diode structure 102.

In an idealized case wherein the front surface reflects no perpendicular light and 100% of oblique light, the redirection layer redirects with 100% efficiency, and there are no optical losses, every photon emitted by the active layer 104 will exit the front surface of the semiconductor diode structure 102 as device output light after at most two round trips through the semiconductor diode structure 102 and two redirections by the redirection surface 108. In reality, of course, none of those condition is fully met. Despite the anti-reflection coating 106, the front surface will nevertheless reflect some small fraction of perpendicular light, resulting in at least two additional round trips for those photons. The front surface of the semiconductor diode structure 102 might absorb or scatter some small fraction of incident light contributing to round-trip optical loss. The lateral surfaces of the semiconductor diode structure 102 might absorb, scatter, or transmit some small fraction of incident light, contributing to round-trip optical loss. Such optical losses arising from the front and lateral surfaces of the semiconductor diode structure 102 result in some fraction of emitted photons that never exit the semiconductor diode structure 102 (at least not in the desired output direction) and reduced extraction efficiency. If sufficiently low, such optical losses can be tolerated, if the resulting extraction efficiency is sufficiently high.

Perhaps most significantly, the redirection layer 108 typically will exhibit less than 100% redirection efficiency (defined as the fraction of incident oblique light redirected to propagate as perpendicular light, or vice versa). The nature of the deviation from 100% redirection efficiency is significant, as well as its magnitude. If the light that is not suitably redirected still propagates within the semiconductor diode structure (e.g., perpendicular light redirected as a mixture of oblique and perpendicular light (advantageous), or oblique light redirected as a mixture of oblique and perpendicular light (disadvantageous)), then there will be further opportunities for conversion to forward-propagating perpendicular light and eventual escape from the semiconductor diode structure 102 as device output light. An average number of round trips required to reach a given probability for photon escape depends on the specific fractions of oblique and perpendicular light produced by each interaction with the redirection surface 108. If round-trip optical losses are sufficiently low, those additional round trips can be tolerated; such scenarios can yield inventive light-emitting devices with adequate extraction efficiencies. More problematic is a redirection layer 108 that is lossy (e.g., by absorption, scattering, or transmission). Any optical loss arising from the redirection layer 108 results in photons that never exit the semiconductor diode structure 102 (at least not in the desired output direction) and reduced extraction efficiency. Again, if sufficiently low, such optical loss exhibited by the redirection layer 108 can be tolerated, if the resulting extraction efficiency is sufficiently high.

In some examples arranged as in FIG. 1 the redirection layer 108 exhibits an efficiency of redirection, of the light incident within the semiconductor diode structure on the redirection layer at an incidence angle greater than $\Theta_C$ to propagate toward the front surface of the semiconductor diode structure at an incidence angle with respect to the front surface that is less than $\Theta_C$, that is greater than about 80.%, greater than about 85.%, greater than about 90.%, or greater than about 95.%. In some examples arranged as in FIG. 1 the redirection layer 108 exhibits optical loss per pass for light incident thereon that is less than about 20.%, less than about 10.%, less than about 5.%, less than about 2.0%, or less than about 1.0%. Design or optimization of the redirection layer 108 can be performed (by calculation, simulation, or iterative designing/making/testing of prototypes or test devices), typically with increased overall extraction efficiency as a primary or secondary figure-of-merit. Instead or in addition, reduction of cost or manufacturing complexity can be employed as primary or secondary figures-of-merit in such design or optimization processes.

Figure 3:
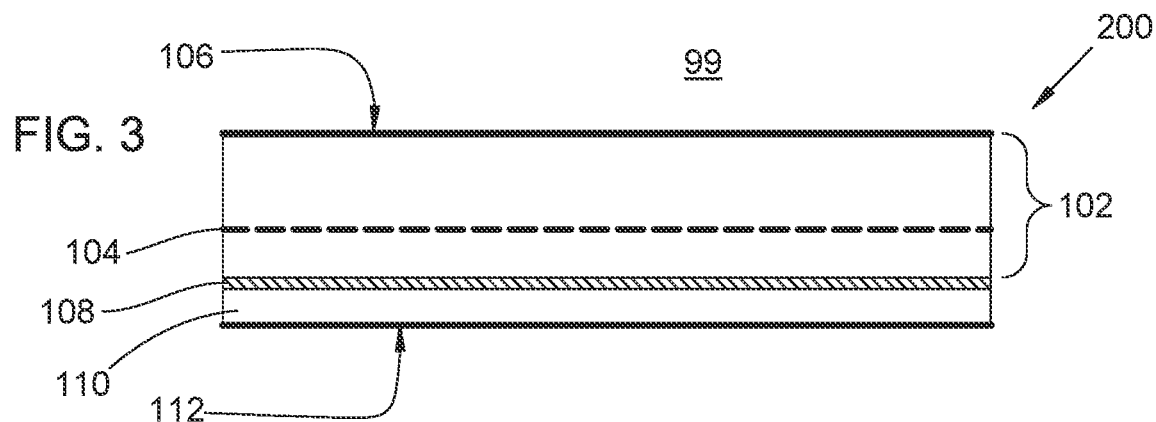
FIG. 3 is a schematic cross-sectional view of another example of an inventive light-emitting device.

A second example of an inventive light-emitting device 100 is illustrated schematically in FIG. 3 and includes a semiconductor diode structure 102, one or more light-emitting active layers 104, an anti-reflection coating 106 on the front surface (i.e., the exit surface) of the semiconductor diode structure 102, and a redirection layer 108 on the back surface of the semiconductor diode structure 102. In this example the device 100 further includes a dielectric layer 110 and a reflective layer 112. The dielectric layer 110 is positioned on the back surface of the redirection layer 108 (with the redirection layer 108 between the dielectric layer 110 and the back surface of the semiconductor diode structure 102), and is substantially transparent and characterized by a refractive index lower than that of the semiconductor diode structure (at the nominal vacuum wavelength $\lambda_0$). The reflective layer 112 is positioned on the back surface of the dielectric layer 110 (with the dielectric layer 110 between the reflective layer 112 and the back surface of the redirection layer 108). The semiconductor diode structure 102, active layer 104, and anti-reflection coating 106 can be arranged in any suitable way with any suitable material composition, including those described above. The reflective layer 112 can exhibit reflectivity, at the nominal vacuum wavelength $\lambda_0$, that is greater than about 90.%, greater than about 95.%, or greater than about 98.%. Typically, larger reflectivity will result in higher extraction efficiency. The reflective layer 112 can be of any suitable type or arrangement, and can include one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys. In some examples, the reflective layer 112 includes a metallic coating or a dielectric coating (e.g., a multi-layer dielectric thin film). The dielectric layer 110 can be a few hundred nanometers thick up to several micrometers thick, and can include one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Figure 4:
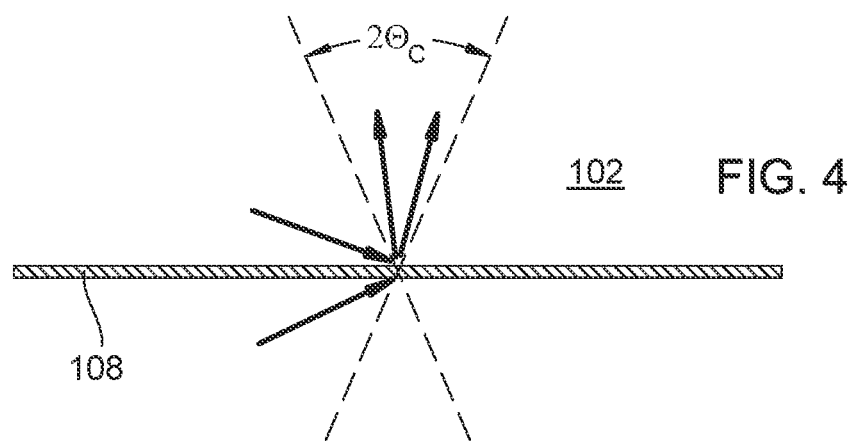
FIG. 4 illustrates schematically another example of redirection of active-layer output light.
Figure 5A:
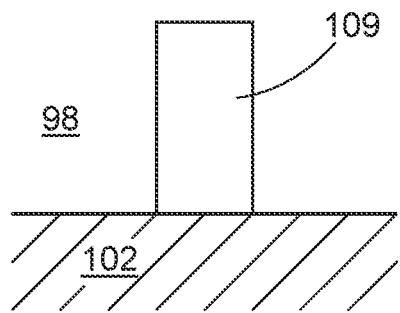
FIGS. 5A through 5D illustrate schematically several examples of nano-antennas.
Figure 5B:
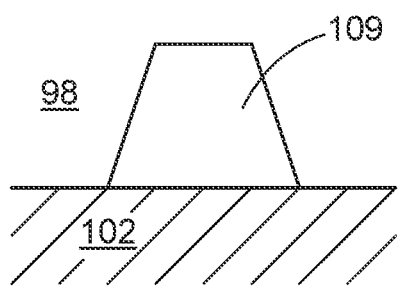
Figure 5C:
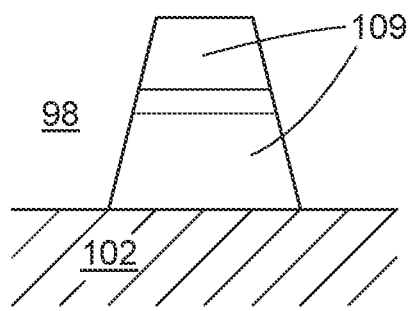
Figure 5D:
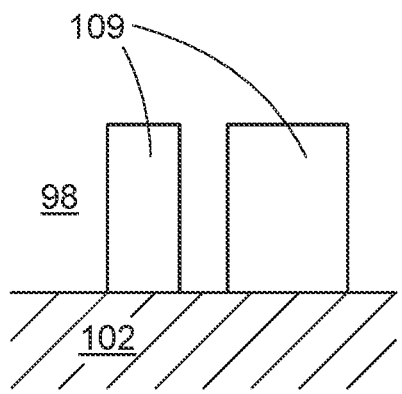
Figure 6:
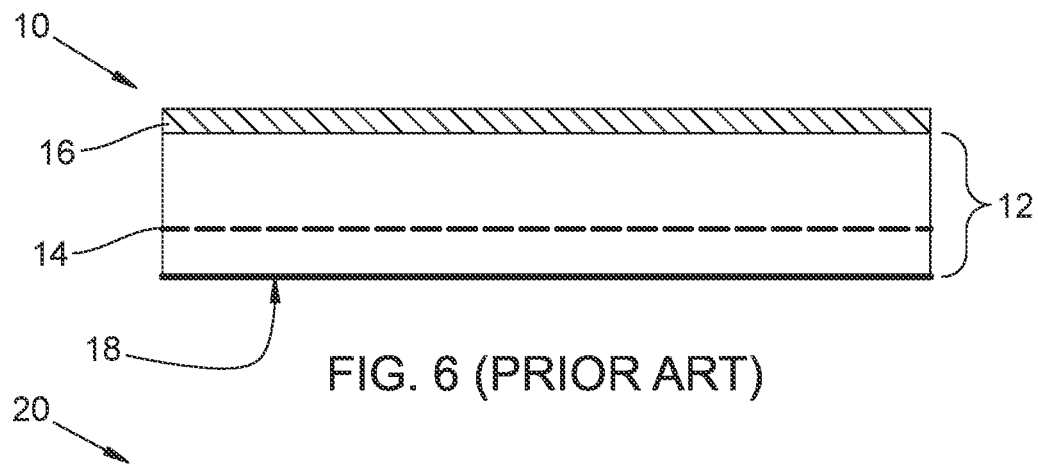
FIG. 6 is a schematic cross-sectional view of an example of a conventional light-emitting device.
Figure 7:
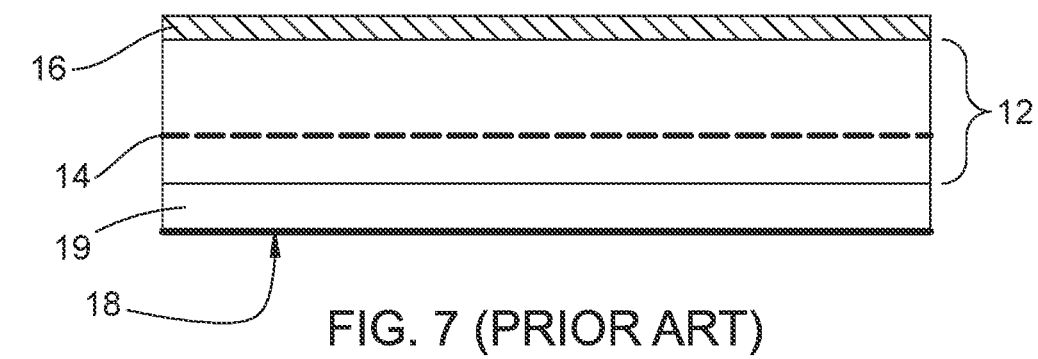
FIG. 7 is a schematic cross-sectional view of another example of a conventional light-emitting device.

In the example of FIG. 3, oblique light emitted by the active layer 104 propagates within the semiconductor diode structure 102, and is reflected or redirected within the semiconductor diode structure 102 (by the front surface, lateral surfaces, or the redirection layer 108) as described above. However, instead of representing optical loss (as in the example of FIG. 1), light that is transmitted by the redirection layer 108 propagates within the dielectric layer 110, is reflected by the reflective layer 112, and propagates forward toward the redirection layer 108. That particular optical loss mechanism of the arrangement of FIG. 1 therefore can be mitigated by the presence of the dielectric layer 110 and the reflective layer 112. The redirection layer 108 can be arranged (e.g., as in FIG. 4) so as to exhibit (i) preferential redirection of oblique light incident within the semiconductor diode structure 102 to propagate as perpendicular light within the semiconductor diode structure 102, and (ii) preferential redirection of oblique light incident within the dielectric layer 110 to propagate as perpendicular light within the semiconductor diode structure 102. The redirection layer 108 can be arranged so as to exhibit redirection efficiency for those processes that is greater than about 20.%, greater than about 40.%, greater than about 60.%, or greater than about 80.%. In some examples it may be possible to maximize or optimize efficiencies of both of those processes simultaneously. More typically such simultaneous optimization is not possible, and a compromise structure for the redirection layer can be chosen that exhibits sufficient redirection efficiency for each process to provide a necessary, desirable, or suitable extraction efficiency. Redirection of any perpendicular light propagating in the semiconductor diode structure 102 or in the dielectric layer 110 can also be considered when designing or optimizing the redirection layer 108.

In some examples arranged as in FIG. 3, the back surface of the dielectric layer 110 includes corrugations, dimples, bumps, protrusions, or depressions; those surface features can arise during growth or deposition of the dielectric layer 110 on the redirection layer 108, if the morphology of the redirection layer 108 is not planar. That is often the case, e.g., when the redirection layer includes an array of nano-antennae, meta-atoms, or meta-molecules. That topology is reflected to some degree (typically somewhat smoothed out) in the surface of the dielectric layer. Deposition or growth of the reflective layer 112 often results in roughly conformal coverage of the surface of the dielectric layer 110. The non-planarity of the dielectric layer 110 can be advantageous, in that reflection from that surface will tend to mix oblique and perpendicular light propagating within the dielectric layer, which in some instances can enhance overall extraction efficiency. In some examples, such non-planarity of the dielectric layer 110 can be imparted by design, e.g., to a degree greater than that arising from the presence of the redirection layer 108 during deposition or growth of the dielectric layer 110.

Whichever of the arrangements described above is employed, in some examples the light-emitting device 100 can exhibit an extraction efficiency that is greater than about 80.%, greater than about 90.%, or greater than about 95.%. In some examples the light-emitting device 100 exhibits a mean number of redirections per photon emitted by the active layer 104 (by the redirection surface 108 or, if present, the reflective layer 112), before transmission by the front surface, that is less than 30, less than 20, less than 10, or less than 5.

In some examples the redirection layer 108 can include an array of nano-antennae 109. Several examples are illustrated schematically in FIGS. 5A-5D, in which the nano-antennae 109 are shown extending from the semiconductor diode structure 102 into a medium 98 (e.g., an encapsulant or ambient medium against the redirection layer 108); in other examples (not shown) the nano-antennae 109 can extend from the surface of the semiconductor diode structure 102 into the dielectric layer 110, or can extend from the surface into the semiconductor material of the diode structure 102. The nano-antennae can include one or more antenna materials, and can be shaped, sized and spaced relative to the nominal output vacuum wavelength $\lambda_0$, and arranged along the redirection layer 108) so as to reradiate, upon irradiation by active-layer output light at an incidence angle greater than the critical angle $\Theta_C$, at least a portion of the active-layer output light so as to result collectively in redirection of that active-layer output light to propagate at an incidence angle less than $\Theta_C$. Any suitable sizes, spacing, materials (e.g., silicon or $TiO_2$), antenna shapes (e.g., cylindrical, frusto-conical, frusto-pyramidal, horizontal dimers, vertical dimers, coaxial dimers, and so forth; as in, e.g., FIGS. 5A-5D), and arrangements (e.g., triangular grid, rectangular grid, hexagonal grid, other grids, or an irregular, aperiodic, or random arrangement) can be employed. Typically, calculation or computer simulation is required to achieve at least a preliminary design for a nano-antennae array; a final design can typically be achieved by iterative experimental optimization of the various parameters by fabricating and characterizing light-emitting device incorporating test arrays in their corresponding redirection layers 108. Note that an array that is not necessarily fully optimized can nevertheless provide redirection efficiency adequate to provide an acceptably high extraction efficiency for the light-emitting device 100; such partly optimized arrays fall within the scope of the present disclosure or appended claims. Examples of suitable nano-antennae arrays can be found in, e.g., (i) Li et al, "All-Dielectric Antenna Wavelength Router with Bidirectional Scattering of Visible Light," *Nano Letters*, 16 4396 (2016), and (ii) (i) Shibanuma et al, "Experimental Demonstration of Tunable Directional Scattering of Visible Light from All-Dielectric Asymmetric Dimers," *ACS Photonics*, 4 489 (2017), which are incorporated by reference as if fully set forth herein.

In some examples, the redirection layer 108 can include a partial photonic bandgap structure arranged with one or more materials, morphology, and spacing relative the nominal output vacuum wavelength $\lambda_0$, so as to redirect, upon irradiation by active-layer output light at an incidence angle greater than the critical angle $\Theta_C$, at least a portion of the active-layer output light to propagate at an incidence angle less than $\Theta_C$. In some examples the redirection layer 108 can include a photonic crystal arranged with one or more materials, crystal morphology, and crystal-lattice spacing relative the nominal output vacuum wavelength $\lambda_0$, so as to redirect, upon irradiation by active-layer output light at an incidence angle greater than the critical angle $\Theta_C$, at least a portion of the active-layer output light to propagate at an incidence angle less than $\Theta_C$. In some examples the redirection layer can include an array of meta-atoms or meta-molecules that are composed of one or more meta-materials, sized relative to the nominal output vacuum wavelength $\lambda_0$, arranged along the redirection layer 108 and spaced relative to the nominal output vacuum wavelength $\lambda_0$, and shaped so as to reradiate, upon irradiation by active-layer output light at an incidence angle greater than the critical angle $\Theta_C$, at least a portion of the active-layer output light so as to result collectively in redirection of that active-layer output light to propagate at an incidence angle less than $\Theta_C$. In some examples the redirection layer can include an efficient diffuse backscatterer or any suitable type or arrangement so as to backscatter, upon irradiation by active-layer output light at an incidence angle greater than the critical angle $\Theta_C$, at least a portion of the incident active-layer output light to propagate at an incidence angle less than $\Theta_C$. In any of those examples, calculation or simulation followed by iterative experimental optimization (or at least partial optimization) can be employed, in a manner similar to that described above.

In any of the arrangements described above for the redirection layer 108, the redirection layer 108 can include one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

Methods for making an inventive light-emitting device 100 include: (a) forming within the semiconductor diode structure 102 the one or more light-emitting layers 104; (b) forming on the front surface of the semiconductor diode structure 102 the anti-reflection coating 106; (c) forming on the back surface of the semiconductor diode structure 102 the redirection layer 108. A method can further include: (d) forming on the back surface of the redirection layer 108 the dielectric layer 110; and (e) forming on the back surface of the dielectric layer 110 the reflective layer 112. Any suitable one or more fabrication or material processing techniques can be employed, in particular for forming the active layers 104 and the redirection layer 108 in any suitable arrangement (including all of those described above). Suitable techniques can include, but are not limited to, layer growth, masked or non-masked deposition, masked or non-masked lithography, masked or non-masked wet or dry etching, epitaxy, direct-write, self-assembly, and so forth. Which one or more techniques are suitable, desirable, or necessary depends on the nature of the active layer 104 and the redirection surface 108 (e.g., p-n junction, multi-quantum well, nano-antenna array, meta-molecules, or other).

A method for operating an inventive light-emitting device 100 includes supplying electrical power to the light-emitting device 100 so that it emits device output light from the front surface of the semiconductor diode structure 102 to propagate in the ambient medium 99.

In addition to the preceding, the following example embodiments fall within the scope of the present disclosure or appended claims:

Example 1. A semiconductor light-emitting device comprising: (a) a semiconductor diode structure having front and back surfaces, the front surface being characterized, with respect to an ambient medium, by a critical angle $\Theta_C$ at a nominal vacuum wavelength $\lambda_0$; (b) one or more light-emitting active layers within the semiconductor diode structure that are arranged so as to emit active-layer output light at the nominal vacuum wavelength $\lambda_0$ to propagate within the semiconductor diode structure; (c) an anti-reflection coating on the front surface of the semiconductor diode structure that is arranged so that the front surface exhibits reflectivity, for light incident on the front surface within the semiconductor diode structure at an incidence angle less than $\Theta_C$, at the nominal vacuum wavelength $\lambda_0$, and with the front surface against the ambient medium, that is less than corresponding Fresnel reflectivity of an interface between semiconductor diode structure material and the ambient medium without the anti-reflection coating; and (d) a redirection layer on the back surface of the semiconductor diode structure, the redirection layer including one or more of (i) an array of nano-antennae, (ii) a partial photonic bandgap structure, (iii) a photonic crystal, or (iv) an array of meta-atoms or meta-molecules, the redirection layer being structurally arranged so as to redirect at least a portion of active-layer output light, incident within the semiconductor diode structure on the redirection layer at an incidence angle greater than $\Theta_C$, to propagate toward the front surface of the semiconductor diode structure at an incidence angle with respect to the front surface that is less than $\Theta_C$, (e) the semiconductor light-emitting device exhibiting transmission by the front surface, as device output light that propagates in the ambient medium, of first and second portions of the active-layer output light propagating within the semiconductor diode structure, the first portion without redirection by the redirection layer and the second portion with redirection by the redirection layer.

Example 2. The device of Example 1 wherein the light-emitting device exhibits a photon extraction efficiency that is greater than about 80.%, greater than about 90.%, or greater than about 95.%.

Example 3. The device of any one of Examples 1 or 2 wherein the light-emitting device exhibits a mean number of redirections per photon emitted by the active layer, by the redirection surface before transmission by the front surface, that is less than 30, less than 20, less than 10, or less than 5.

Example 4. The device of any one of Examples 1 through 3 wherein the redirection layer exhibits a redirection efficiency, of the light incident within the semiconductor diode structure on the redirection layer at an incidence angle greater than $\Theta_C$ to propagate toward the front surface of the semiconductor diode structure at an incidence angle with respect to the front surface that is less than $\Theta_C$, that is greater than about 80.%, greater than about 85.%, greater than about 90.%, or greater than about 95.%.

Example 5. The device of Example 4 wherein the redirection layer exhibits optical loss per pass for light incident thereon that is less than about 20.%, less than about 10.%, less than about 5.%, less than about 2.0%, or less than about 1.0%.

Example 6. The device of any one of Examples 1 through 3 further comprising: (e) a dielectric layer on a back surface of the redirection layer with the redirection layer between the dielectric layer and the back surface of the semiconductor diode structure, the dielectric layer being, at the nominal vacuum wavelength $\lambda_0$, substantially transparent and characterized by a refractive index lower than that of the semiconductor diode structure; and (f) a reflective layer on a back surface of the dielectric layer with the dielectric layer between the reflective layer and the back surface of the redirection layer.

Example 7. The device of Example 6 wherein the redirection layer exhibits an efficiency of redirection, of the light incident within the semiconductor diode structure on the redirection layer at an incidence angle greater than $\Theta_C$ to propagate toward the front surface of the semiconductor diode structure at an incidence angle with respect to the front surface that is less than $\Theta_C$, that is greater than about 20.%, greater than about 40.%, greater than about 60.%, or greater than about 80.%.

Example 8. The device of any one of Examples 6 or 7 wherein the redirection layer exhibits optical loss per pass for light incident thereon that is less than about 10.%, less than about 5.%, less than about 2.0%, less than about 1.0%, or less than about 0.5%.

Example 9. The device of any one of Examples 6 through 8 wherein the reflective layer exhibits reflectivity, at the nominal vacuum wavelength $\lambda_0$, that is greater than about 90.%, greater than about 95.%, or greater than about 98.%.

Example 10. The device of any one of Examples 6 through 9 wherein the reflective layer includes a metallic coating or a dielectric coating.

Example 11. The device of any one of Examples 6 through 10 wherein the back surface of the dielectric layer includes corrugations, dimples, bumps, protrusions, or depressions.

Example 12. The device of any one of Examples 6 through 11 wherein the dielectric layer includes one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 13. The device of any one of Examples 6 through 12 wherein the reflective layer includes one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

Example 14. The device of any one of Examples 1 through 13 wherein the redirection layer includes an array of nano-antennae that include one or more antenna materials, are shaped, sized, and spaced relative to the nominal output vacuum wavelength $\lambda_0$, and arranged along the redirection layer, so as to reradiate, upon irradiation by active-layer output light at an incidence angle greater than $\Theta_C$, at least a portion of the active-layer output light to result collectively in the redirection thereof to propagate toward the front surface of the semiconductor diode structure at an incidence angle less than $\Theta_C$.

Example 15. The device of any one of Examples 1 through 14 wherein the redirection layer includes a partial photonic bandgap structure arranged with one or more materials, morphology, and spacing relative the nominal output vacuum wavelength $\lambda_0$, so as to redirect, upon irradiation by active-layer output light at an incidence angle greater than $\Theta_C$, at least a portion of the active-layer output light to propagate toward the front surface of the semiconductor diode structure at an incidence angle less than $\Theta_C$.

Example 16. The device of any one of Examples 1 through 15 wherein the redirection layer includes a photonic crystal arranged with one or more materials, crystal morphology, and crystal-lattice spacing relative the nominal output vacuum wavelength $\lambda_0$, so as to redirect, upon irradiation by active-layer output light at an incidence angle greater than $\Theta_C$, at least a portion of the active-layer output light to propagate toward the front surface of the semiconductor diode structure at an incidence angle less than $\Theta_C$.

Example 17. The device of any one of Examples 1 through 16 wherein the redirection layer includes an array of meta-atoms or meta-molecules that include one or more meta-materials, are shaped, sized, and spaced relative to the nominal output vacuum wavelength $\lambda_0$, and arranged along the redirection layer, so as to reradiate, upon irradiation by active-layer output light at an incidence angle greater than $\Theta_C$, at least a portion of the active-layer output light to result collectively in the redirection thereof to propagate toward the front surface of the semiconductor diode structure at an incidence angle less than $\Theta_C$.

Example 18. The device of any one of Examples 1 through 17 wherein the redirection layer includes a diffuse backscatterer arranged so as to backscatter, upon irradiation by active-layer output light at an incidence angle greater than the critical angle $\Theta_C$, at least a portion of the incident active-layer output light to propagate at an incidence angle less than $\Theta_C$.

Example 19. The device of any one of Examples 1 through 18 wherein the redirection layer includes one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

Example 20. The device of any one of Examples 1 through 19 wherein the front surface of the semiconductor diode structure is positioned against the ambient medium, and the ambient medium is substantially solid and includes one or more materials among: doped or undoped silicone, or one or more doped or undoped polymers.

Example 21. The device of any one of Examples 1 through 19 wherein the front surface of the semiconductor diode structure is positioned against the ambient medium, and the ambient medium comprises vacuum, air, a gaseous medium, or a liquid medium.

Example 22. The device of any one of Examples 1 through 21 wherein the anti-reflection coating includes a single-layer quarter-wave dielectric thin film or a multi-layer dielectric thin film.

Example 23. The device of any one of Examples 1 through 22 wherein the anti-reflection coating includes a moth-eye structure or an index-gradient film.

Example 24. The device of any one of Examples 1 through 23 wherein reflectivity of the front surface of the semiconductor diode structure with the anti-reflection coating is less than about 10.%, less than about 5.%, less than about 2.0%, less than about 1.0%, or less than about 0.5%.

Example 25. The device of any one of Examples 1 through 24 wherein the anti-reflection coating includes one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 26. The device of any one of Examples 1 through 25 wherein the nominal output vacuum wavelength $\lambda_0$ is larger than about 0.20 μm, larger than about 0.4 μm, larger than about 0.8 μm, smaller than about 10. μm, smaller than about 2.5 μm, or smaller than about 1.0 μm.

Example 27. The device of any one of Examples 1 through 26 wherein the semiconductor light-emitting device comprises a semiconductor light-emitting diode.

Example 28. The device of any one of Examples 1 through 27 wherein the semiconductor diode structure includes one or more doped or undoped III-V, II-VI, or Group IV semiconductor materials or alloys or mixtures thereof.

Example 29. The device of any one of Examples 1 through 28 wherein the light-emitting layer includes one or more doped or undoped III-V, II-VI, or Group IV semiconductor materials or alloys or mixtures thereof.

Example 30. The device of any one of Examples 1 through 29 wherein the light-emitting layer includes one or more p-n junctions, one or more quantum wells, one or more multi-quantum wells, or one or more quantum dots.

Example 31. A method for making the light-emitting device of any one of Examples 1 through 30, the method comprising: (a) forming within the semiconductor diode structure the one or more light-emitting active layers; (b) forming on the front surface of the semiconductor diode structure the anti-reflection coating; and (c) forming on the back surface of the semiconductor diode structure the redirection layer.

Example 32. The method of Example 31 further comprising: (d) forming on the back surface of the redirection layer the dielectric layer with the redirection layer between the dielectric layer and the back surface of the semiconductor diode structure; and (e) forming on the back surface of the dielectric layer the reflective layer with the dielectric layer between the reflective layer and the back surface of the redirection layer.

Example 33. A method for operating the light-emitting device of any one of Examples 1 through 30, the method comprising supplying to the light-emitting device electrical power so that the light-emitting device emits device output light from the front surface of the semiconductor diode structure to propagate in the ambient medium against the front surface.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:
   a semiconductor diode structure having front and back surfaces, the front surface being characterized, with respect to an ambient medium, by a critical angle $\Theta_C$ at a nominal vacuum wavelength $\lambda_0$;
   one or more light-emitting active layers within the semiconductor diode structure that are arranged so as to emit an active-layer output light at the nominal vacuum wavelength $\lambda_0$ to propagate within the semiconductor diode structure;

an anti-reflection coating on the front surface of the semiconductor diode structure that is arranged so that the front surface exhibits reflectivity that is less than corresponding Fresnel reflectivity of an interface between the ambient medium and a material of the front surface of the semiconductor diode structure without the anti-reflection coating, for light incident on the front surface within the semiconductor diode structure at an incidence angle less than $\Theta_C$ at the nominal vacuum wavelength $\lambda_0$, and with the front surface against the ambient medium; and a redirection layer on the back surface of the semiconductor diode structure, the redirection layer including one or more of (i) an array of nano-antennae, (ii) a partial photonic bandgap structure, (iii) a photonic crystal, or (iv) an array of meta-atoms or meta-molecules, the redirection layer being structurally arranged so as to redirect at least a portion of the active-layer output light, incident within the semiconductor diode structure on the redirection layer at an incidence angle greater than $\Theta_C$, to propagate toward the front surface of the semiconductor diode structure at an incidence angle with respect to the front surface that is less than $\Theta_C$, the semiconductor light-emitting device exhibiting (i) transmission by the front surface, as a device output light that propagates in the ambient medium, of first and second portions of the active-layer output light propagating within the semiconductor diode structure, the first portion without redirection by the redirection layer and the second portion with redirection by the redirection layer, and (ii) a mean number of redirections per photon emitted by the active layer, by the redirection layer before transmission by the front surface, that is less than 30.

2. The device of claim 1 wherein the semiconductor light-emitting device exhibits a photon extraction efficiency that is greater than about 80.%.

3. The device of claim 1 wherein the redirection layer exhibits a redirection efficiency, of the light incident within the semiconductor diode structure on the redirection layer at an incidence angle greater than $\Theta_C$ to propagate toward the front surface of the semiconductor diode structure at an incidence angle with respect to the front surface that is less than $\Theta_C$, that is greater than about 80.%.

4. The device of claim 3 wherein the redirection layer exhibits optical loss per pass that is less than about 20.% for the light incident within the semiconductor diode structure on the redirection layer.

5. The device of claim 1 further comprising:
a dielectric layer on a back surface of the redirection layer with the redirection layer between the dielectric layer and the back surface of the semiconductor diode structure, the dielectric layer being, at the nominal vacuum wavelength $\lambda_0$, substantially transparent and characterized by a refractive index lower than that of the semiconductor diode structure; and
a reflective layer on a back surface of the dielectric layer with the dielectric layer between the reflective layer and the back surface of the redirection layer.

6. The device of claim 5 wherein the redirection layer exhibits an efficiency of redirection, of the light incident within the semiconductor diode structure on the redirection layer at an incidence angle greater than $\Theta_C$ to propagate toward the front surface of the semiconductor diode structure at an incidence angle with respect to the front surface that is less than $\Theta_C$, that is greater than about 20.%.

7. The device of claim 5 wherein the redirection layer exhibits optical loss per pass for light incident thereon that is less than about 10.%.

8. The device of claim 5 wherein the reflective layer exhibits reflectivity, at the nominal vacuum wavelength $\lambda_0$, that is greater than about 90.%.

9. The device of claim 5 wherein the reflective layer includes a metallic coating or a dielectric coating.

10. The device of claim 5 wherein the back surface of the dielectric layer includes corrugations, dimples, bumps, protrusions, or depressions.

11. The device of claim 1 wherein the redirection layer includes an array of nano-antennae that include one or more antenna materials, are shaped, sized, and spaced relative to the nominal output vacuum wavelength $\lambda_0$, and arranged along the redirection layer, so as to reradiate, upon irradiation by the active-layer output light at an incidence angle greater than $\Theta_C$, at least a portion of the active-layer output light to result collectively in the redirection thereof to propagate toward the front surface of the semiconductor diode structure at an incidence angle less than $\Theta_C$.

12. The device of claim 1 wherein the redirection layer includes a partial photonic bandgap structure arranged with one or more materials, morphology, and spacing relative the nominal output vacuum wavelength $\lambda_0$, so as to redirect, upon irradiation by the active-layer output light at an incidence angle greater than $\Theta_C$, at least a portion of the active-layer output light to propagate toward the front surface of the semiconductor diode structure at an incidence angle less than $\Theta_C$.

13. The device of claim 1 wherein the redirection layer includes a photonic crystal arranged with one or more materials, crystal morphology, and crystal-lattice spacing relative the nominal output vacuum wavelength $\lambda_0$, so as to redirect, upon irradiation by the active-layer output light at an incidence angle greater than $\Theta_C$, at least a portion of the active-layer output light to propagate toward the front surface of the semiconductor diode structure at an incidence angle less than $\Theta_C$.

14. The device of claim 1 wherein the redirection layer includes an array of meta-atoms or meta-molecules that include one or more meta-materials, are shaped, sized, and spaced relative to the nominal output vacuum wavelength $\lambda_0$, and arranged along the redirection layer, so as to reradiate, upon irradiation by the active-layer output light at an incidence angle greater than $\Theta_C$, at least a portion of the active-layer output light to result collectively in the redirection thereof to propagate toward the front surface of the semiconductor diode structure at an incidence angle less than $\Theta_C$.

15. The device of claim 1 wherein the redirection layer includes a diffuse backscatterer arranged so as to backscatter, upon irradiation by the active-layer output light at an incidence angle greater than the critical angle $\Theta_C$, at least a portion of the incident active-layer output light to propagate at an incidence angle less than $\Theta_C$.

16. The device of claim 1 wherein reflectivity of the front surface of the semiconductor diode structure with the anti-reflection coating is less than about 10.%.

17. The device of claim 1 wherein the semiconductor light-emitting device comprises a semiconductor light-emitting diode.

18. A method for making a semiconductor light-emitting device, the method comprising:
forming within a semiconductor diode structure one or more light-emitting active layers that are arranged so as to emit an active-layer output light at a nominal vacuum wavelength $\lambda_0$ to propagate within the semiconductor diode structure, the semiconductor diode structure being characterized with respect to an ambient medium by a critical angle $\Theta_C$ at the nominal vacuum wavelength $\lambda_0$;

forming on a front surface of the semiconductor diode structure an anti-reflection coating that is arranged so that the front surface exhibits reflectivity that is less than corresponding Fresnel reflectivity of an interface between the ambient medium and a material of the front surface of the semiconductor diode structure without the anti-reflection coating, for light incident on the front surface within the semiconductor diode structure at an incidence angle less than $\Theta_C$ at the nominal vacuum wavelength $\lambda_0$, and with the front surface against the ambient medium; and forming on a back surface of the semiconductor diode structure a redirection layer, the redirection layer including one or more of (i) an array of nano-antennae, (ii) a partial photonic bandgap structure, (iii) a photonic crystal, or (iv) an array of meta-atoms or meta-molecules, the redirection layer being structurally arranged so as to redirect at least a portion of the active-layer output light, incident within the semiconductor diode structure on the redirection layer at an incidence angle greater than $\Theta_C$, to propagate toward the front surface of the semiconductor diode structure at an incidence angle with respect to the front surface that is less than $\Theta_C$, the semiconductor light-emitting device exhibiting (i) transmission by the front surface, as a device output light that propagates in the ambient medium, of first and second portions of the active-layer output light propagating within the semiconductor diode structure, the first portion without redirection by the redirection layer and the second portion with redirection by the redirection layer, and (ii) a mean number of redirections per photon emitted by the active layer, by the redirection layer before transmission by the front surface, that is less than 30.

19. The method of claim 18 further comprising:

forming on a back surface of the redirection layer a dielectric layer with the redirection layer between the dielectric layer and the back surface of the semiconductor diode structure, the dielectric layer being, at the nominal vacuum wavelength $\lambda_0$, substantially transparent and characterized by a refractive index lower than that of the semiconductor diode structure; and forming on a back surface of the dielectric layer a reflective layer with the dielectric layer between the reflective layer and the back surface of the redirection layer.

20. A method for operating a semiconductor light-emitting device assembly, the method comprising supplying an electric power to the semiconductor light-emitting device so that the semiconductor light-emitting device emits a device output light from a front surface of a semiconductor diode structure to propagate in an ambient medium against the front surface:

the front surface of the semiconductor diode structure being characterized, with respect to the ambient medium, by a critical angle $\Theta_C$ at a nominal vacuum wavelength $\lambda_0$;

one or more light-emitting active layers within the semiconductor diode structure being arranged so as to emit an active-layer output light at the nominal vacuum wavelength $\lambda_0$ to propagate within the semiconductor diode structure;

an anti-reflection coating on the front surface of the semiconductor diode structure being arranged so that the front surface exhibits reflectivity that is less than corresponding Fresnel reflectivity of an interface between the ambient medium and a material of the front surface of the semiconductor diode structure without the anti-reflection coating, for light incident on the front surface within the semiconductor diode structure at an incidence angle less than $\Theta_C$ at the nominal vacuum wavelength $\lambda_0$, and with the front surface against the ambient medium;

a redirection layer on a back surface of the semiconductor diode structure including one or more of (i) an array of nano-antennae, (ii) a partial photonic bandgap structure, (iii) a photonic crystal, or (iv) an array of meta-atoms or meta-molecules, the redirection layer being structurally arranged so as to redirect at least a portion of the active-layer output light, incident within the semiconductor diode structure on the redirection layer at an incidence angle greater than $\Theta_C$, to propagate toward the front surface of the semiconductor diode structure at an incidence angle with respect to the front surface that is less than $\Theta_C$, the semiconductor light-emitting device exhibiting (i) transmission by the front surface, as the device output light that propagates in the ambient medium, of first and second portions of the active-layer output light propagating within the semiconductor diode structure, the first portion without redirection by the redirection layer and the second portion with redirection by the redirection layer, and (ii) a mean number of redirections per photon emitted by the active layer, by the redirection layer before transmission by the front surface, that is less than 30.

* * * * *

UNITED STATES PATENT AND TRADEMARK OFFICE
CERTIFICATE OF CORRECTION

PATENT NO. : 11,641,007 B2
APPLICATION NO. : 17/121014
DATED : May 2, 2023
INVENTOR(S) : Antonio Lopez-Julia et al.

Page 1 of 1

It is certified that error appears in the above-identified patent and that said Letters Patent is hereby corrected as shown below:

In the Claims

In Claim 12 (Column 18 Line 24):
Please insert --to-- between "relative" and "the"

In Claim 13 (Column 18 Line 34):
Please insert --to-- between "relative" and "the"

Signed and Sealed this
Twenty-third Day of April, 2024

Katherine Kelly Vidal
Director of the United States Patent and Trademark Office